(12) United States Patent
Chen

(10) Patent No.: US 7,106,568 B2
(45) Date of Patent: Sep. 12, 2006

(54) SUBSTRATE-TRIGGERED ESD CIRCUIT BY USING TRIPLE-WELL

(75) Inventor: Shiao-Shien Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/711,141

(22) Filed: Aug. 27, 2004

(65) Prior Publication Data

US 2006/0044714 A1 Mar. 2, 2006

(51) Int. Cl.
*H02H 3/20* (2006.01)
*H02H 9/04* (2006.01)
*H02H 9/00* (2006.01)
*H02H 3/22* (2006.01)

(52) U.S. Cl. ............... 361/91.1; 361/56; 361/111

(58) Field of Classification Search ........... 361/91.1, 361/56, 111
See application file for complete search history.

(56) References Cited

U.S. PATENT DOCUMENTS

2002/0181177 A1* 12/2002 Ker et al. ............... 361/56

* cited by examiner

*Primary Examiner*—Brian Sircus
*Assistant Examiner*—Dharti H. Patel
(74) *Attorney, Agent, or Firm*—Winston Hsu

(57) ABSTRACT

An electrostatic discharge (ESD) protection circuit formed on a P-type substrate has a first $p^+$ diffusion region in the P-type substrate, a N-well in the P-type substrate, a first $n^+$ diffusion region in the N-well, a P-well in the N-well, and an n-p-n bipolar junction transistor (BJT) in the P-well. An equivalent circuit between a base and an emitter of the BJT is a diode without connecting to any resistor in parallel.

20 Claims, 15 Drawing Sheets

SUBSTRATE-TRIGGERED ESD CIRCUIT BY USING TRIPLE-WELL

BACKGROUND OF INVENTION

1. Field of the Invention

The present invention relates to an electrostatic discharge (ESD) protection circuit, and more particularly to a substrate-triggered ESD protection circuit by using triple-well.

2. Description of the Prior Art

With the continued scaling down of semiconductor integrated circuit (IC) devices, the present trend is moving towards production of semiconductor integrated circuits having very small sizes in the advanced sub-quarter-micron CMOS technologies. It is consequently increasingly important to build electrostatic discharge (ESD) protection circuits on the chip to protect the devices and circuits of the IC against ESD-related damage. The ESD robustness of commercial IC products is generally needed to be higher than 2 kV in the human-body-model (HBM) ESD stress. While withstanding ESD overstress, it is desired that the on-chip ESD protection circuits have relatively small dimensional requirements to save silicon area. With respect to this issue, heat dissipation issues become paramount. In the present, the efficiency and performance of the substrate-trigger ESD protection circuits is better than other type ESD protection circuits.

Please refer to FIG. 1 and FIG. 2. FIG. 1 is a structure diagram of a substrate-triggered ESD protection circuit 10 according to the prior art. FIG. 2 is a circuit diagram of the ESD protection circuit 10 shown in FIG. 1. The ESD protection circuit 10 is formed on a P-type substrate 12 and comprises a resistor T, a capacitor C, an inverter 30, a substrate resistor Rsub, a parasitic lateral n-p-n bipolar junction transistor (BJT) 36, and a NMOS transistor 38. The resistor R and the capacitor C are connected in series between a first power terminal $V_{DD}$ and a second power terminal $V_{SS}$. The inverter 30 is connected to the first power terminal $V_{DD}$ and the second power terminal $V_{SS}$. An input terminal of the inverter 30 is connected to the resistor R and the capacitor C, and an output terminal $V_B$ of the inverter 30 is connected to the substrate resistor Rsub and a base of the parasitic lateral n-p-n BJT 36, where the substrate resistor Rsub is an equivalent resistor between the p+ diffusion region 14 and the second power terminal $V_{SS}$. The NMOS 38 comprises a doped polysilicon gate 24, a drain formed by an $n^+$ diffusion region 16, and a source formed by another $n^+$ diffusion region 18. The drain 16 is connected to the first power terminal $V_{DD}$, and the gate 24 and the source 18 are connected to the second power terminal $V_{SS}$. The parasitic lateral n-p-n BJT 36 underneath the NMOS transistor 38 is triggered by a trigger current conducting from the P+ diffusion region 14 to the first power terminal $V_{SS}$. A plurality of hallow trench isolation (STI) structures 26 are used to isolate each NMOS transistor 38 from other electrical devices. Moreover, two N-wells 20 are formed under the sources 18 of the NMOS transistors 38, and a $p^+$ diffusion region 22 in the P-type substrate 12 is connected to the second power terminal $V_{SS}$.

As an ESD phenomenon of the ESD protection circuit 10 occurs, a positive pulse is applied to the first power terminal $V_{DD}$. While the capacitor C is charged by the ESD, a voltage level of the input terminal of the inverter 30 is pulled up. The voltage level of the input terminal of the inverter 30, hence, is at a low state when the ESD phenomenon begins. Therefore, the PMOS transistor 32 is turned on so that an ESD current flows from the PMOS 32 through the output terminal of the inverter 30 and the substrate resistor Rsub to the second power terminal $V_{SS}$. Because of the current flowing through the substrate resistor Rsub, the voltage level of the output terminal of the inverter 30 is pulled up. While the voltage level of the output terminal of the inverter 30 is pulled up to a predetermined level, the parasitic lateral n-p-n BJT 36 is turned on so that another ESD path, i.e. form the parasitic lateral n-p-n BJT 36 to the second power terminal $V_{SS}$, is generated. The inputted ESD, thus, can pass through the ESD path. However, when the ESD phenomenon of the ESD protection circuit 10 begins, the parasitic lateral n-p-n BJT 36 is not turned on until the voltage gap between the two ends of the substrate resistor Rsub exceeds the predetermined level, so the turn-on efficiency of the ESD protection circuit 10 is not ideal.

Please refer to FIG. 3 and FIG. 4. FIG. 3 is a structure diagram of another substrate-triggered ESD protection circuit 50 according to the prior art. FIG. 4 is a circuit diagram of the ESD protection circuit 50 shown in FIG. 4. The ESD protection circuit 50 is formed on a P-type substrate 52 and comprises a resistor T, a capacitor C, two inverters 30, a PMOS transistor 74, and two parasitic lateral p-n-p BJTs 76 and 78. Similar to the ESD protection circuit 10, in the ESD protection circuit 50, the resistor R and the capacitor C are connected in series between the first power terminal $V_{DD}$ and the second power terminal $V_{SS}$. The inverters are connected to the first power terminal $V_{DD}$ and the second power terminal $V_{SS}$. An input terminal of the left inverter 30 is connected to the resistor R and the capacitor C, and an output terminal $V_B$ of the right inverter 30 is connected to bases of the two parasitic lateral p-n-p BJTs 76 and 78. The PMOS transistor 74 is formed in a N-well 54 and comprises a doped polysilicon gate 64, a source formed by an $p^+$ diffusion region 58, and a drain formed by another $p^+$ diffusion region 60. The source 58 is connected to the first power terminal $V_{DD}$, the gate 64 is connected to the output terminal $V_B$ of the right inverter 30, and the drain 60 is connected to the second power terminal $V_{SS}$. The parasitic lateral p-n-p BJT 76 is composed of the $p^+$ diffusion region 58, the N-well 54, and the $p^+$ diffusion region 60, and the parasitic lateral p-n-p BJT 78 is composed of the $p^+$ diffusion region 58, the N-well 54, and the P-type substrate 52. A plurality of hallow trench isolation (STI) structures 66 are used to isolate each PMOS transistor 74 from other electrical devices. Moreover, a $p^+$ diffusion region 62 in the P-type substrate 52 is connected to the second power terminal $V_{SS}$.

As an ESD phenomenon of the ESD protection circuit 50 occurs, a positive pulse is applied to the first power terminal $V_{DD}$. While the capacitor C is charged by the ESD, a voltage level of the input terminal of the left inverter 30 is pulled up. Hence, when the ESD phenomenon begins, the voltage level of the input terminal of the left inverter 30 and the voltage level of the output terminal of the right inverter 30 are both at a high state. Meanwhile, the gate 64 of the PMOS transistor 74 and the bases of the two parasitic lateral p-n-p BJTs 76 and 78 are at a low state. Because the first power terminal VDD is applied by a positive ESD voltage, the channel of the PMOS transistor is turned on and a PN junction is formed between the $p^+$ diffusion region 58 and the N-well 54 that results in turning on of the two parasitic lateral p-n-p BJTs 76 and 78. Therefore, the ESD currents respectively flow from the first power terminal $V_{DD}$ through the channel of the PMOS transistor 74 and the two parasitic lateral p-n-p BJTs 76 and 78 to the second power terminal $V_{SS}$. The PMOS transistor 74 and the two parasitic lateral p-n-p BJTs 76 and 78 are turned on immediately when the positive pulse is applied to the first power terminal $V_{DD}$, so the turn-on efficiency of the ESD protection circuit 50 is better than that of the ESD protection circuit 10. However, because the mobility of holes is less than the mobility of electrons, the discharge performance of the ESD protection circuit 50 is worse than that of the ESD protection circuit 10.

SUMMARY OF INVENTION

It is a primary objective of the present invention to provide a substrate-triggered ESD protection circuit that not only has ideal turn-on efficiency but also has excellent discharge performance so as to resolve the above problems.

In the preferred embodiment of the present invention, the ESD protection circuit is formed on a P-type substrate and comprises a first power terminal, a second power terminal, a resistor connected to the first power terminal, a capacitor connected between the resistor and the second power terminal, a first $p^+$ diffusion region in the P-type substrate connected to the second power terminal, an N-well in the P-type substrate, a first $n^+$ diffusion region in the N-well connected to the first power terminal, a P-well in the N-well, at least a second $p^+$ diffusion region in the P-well, at least a second $n^+$ diffusion region in the P-well connected to the first power terminal, at least third $n^+$ diffusion region in the P-well connected to the second power terminal, and an ESD detecting circuit connected to the first power terminal having an input terminal connected to the resistor and the capacitor and a output terminal connected to the second $p^+$ diffusion region. The output terminal outputs signal opposite to signal received by the input terminal so as to change a voltage level of the P-well.

When static electricity inputs into the ESD protection circuit from the first power terminal, the N-well electrically isolates the P-well from the P-type substrate, so an n-p-n BJT is turned on immediately. Therefore, an equivalent circuit between a base and an emitter of the n-p-n BJT can be regarded as a diode without connecting to any resistor in parallel.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
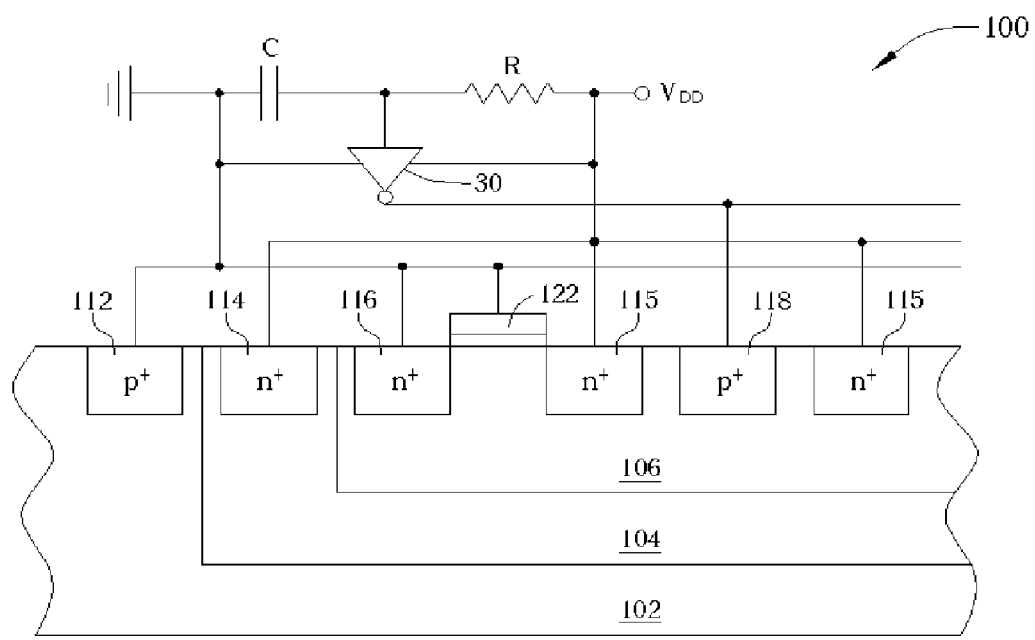
FIG. 5 is a structure diagram of first embodiment substrate-triggered ESD protection circuit according to the present invention.
Figure 6:
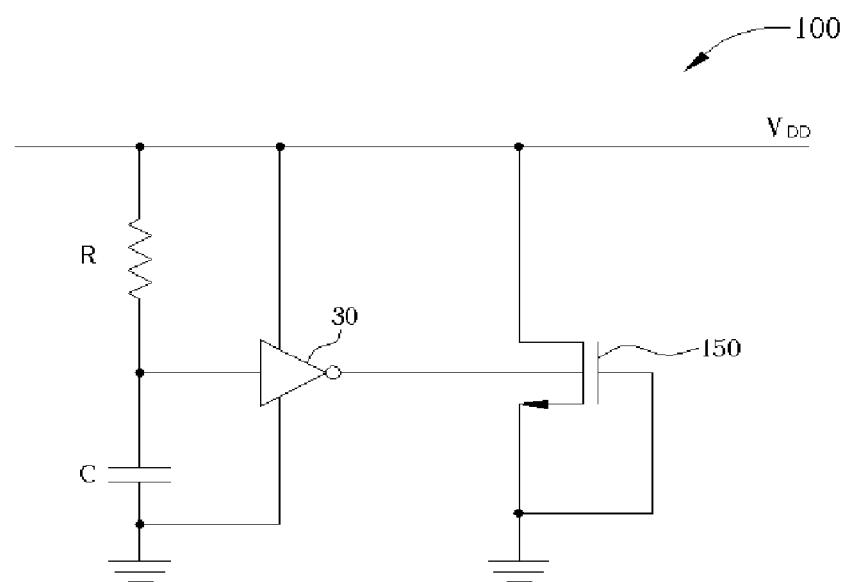
FIG. 6 is a circuit diagram of the ESD protection circuit shown in FIG. 5.

Please refer to FIG. 5 and FIG. 6. FIG. 5 is a structure diagram of first embodiment substrate-triggered ESD protection circuit 100 according to the present invention, and FIG. 6 is a circuit diagram of the ESD protection circuit 100 shown in FIG. 5. The ESD protection circuit 100 is formed on a P-type substrate 102 and comprises a first power terminal $V_{DD}$, a grounded second power terminal (i.e. usually noted as $V_{SS}$ or GND), a resistor R, a capacitor C, a first $p^+$ diffusion region 122, a N-well 104, a first $n^+$ diffusion region 114, a P-well, at least a second $n^+$ diffusion region 115, at least third $n^+$ diffusion region 116, a inverter 30 as a ESD detecting circuit, and a NMOS transistor 150. The resistor R is connected to the first power terminal $V_{DD}$, and the capacitor C is connected between the resistor R and the grounded terminal (i.e. the second power terminal). The first $p^+$ diffusion region 112 and the N-well 104 are positioned in the P-type substrate 102, and the first $p^+$ diffusion region 112 is grounded. The first $n^+$ diffusion region 114 and the P-well 116 are positioned in the N-well 104, and the first $n^+$ diffusion 114 is connected to the first power terminal $V_{DD}$. The second $p^+$ diffusion region 118, the second $n^+$ diffusion region, and the third $n^+$ diffusion region 116 are positioned in the P-well 106. The second $n^+$ diffusion region 115 is connected to the $V_{DD}$, and the third $n^+$ diffusion region 116 is connected to the grounded terminal (i.e. the second power terminal). The ESD detecting circuit 30 is connected to the first power terminal $V_{DD}$ and the grounded terminal and has an input terminal connected to the resistor R and the capacitor C and an output terminal connected to the second $p^+$ diffusion region 118 for outputting voltage signal opposite to the received voltage signal of the input terminal of the ESD detecting circuit 30 so as to change the voltage level of the P-well 106. The drain of the NMOS transistor 150 is the second $n^+$ diffusion region 115, the source of the NMOS transistor 150 is the third $n^+$ diffusion region 116, and the gate of the NMOS transistor 150 is grounded and composed of doped polysilicon. Similar to the ESD protection circuit 10, a parasitic lateral n-p-n BJT (not shown) is formed under the NMOS transistor 150. The collector of the parasitic lateral n-p-n BJT is the second $n^+$ diffusion region 115, a base of the parasitic lateral n-p-n BJT is the P-well 106, and a emitter of the parasitic lateral n-p-n BJT is the third $n^+$ diffusion region 116.

Figure 1:
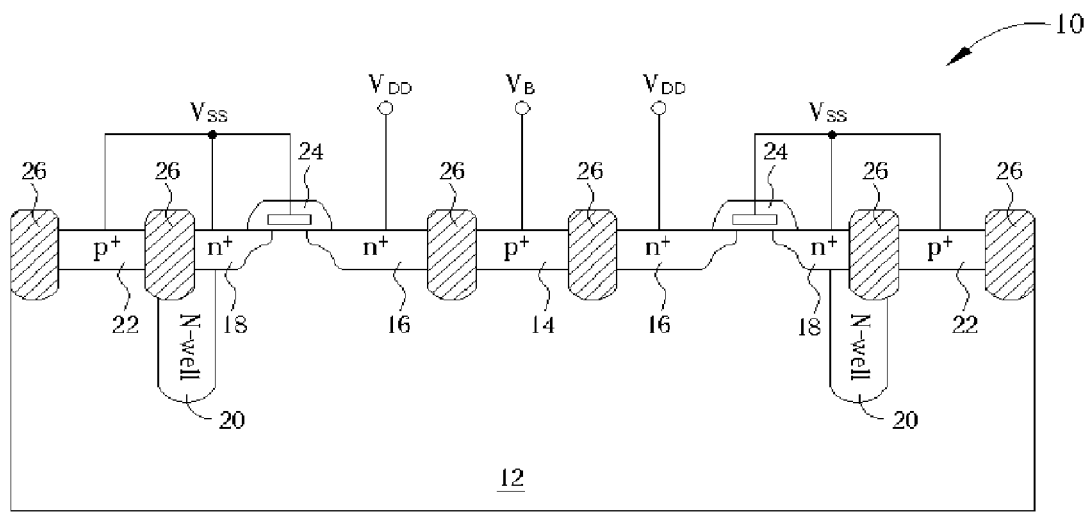
FIG. 1 is a structure diagram of a substrate-triggered ESD protection circuit according to the prior art.
Figure 2:
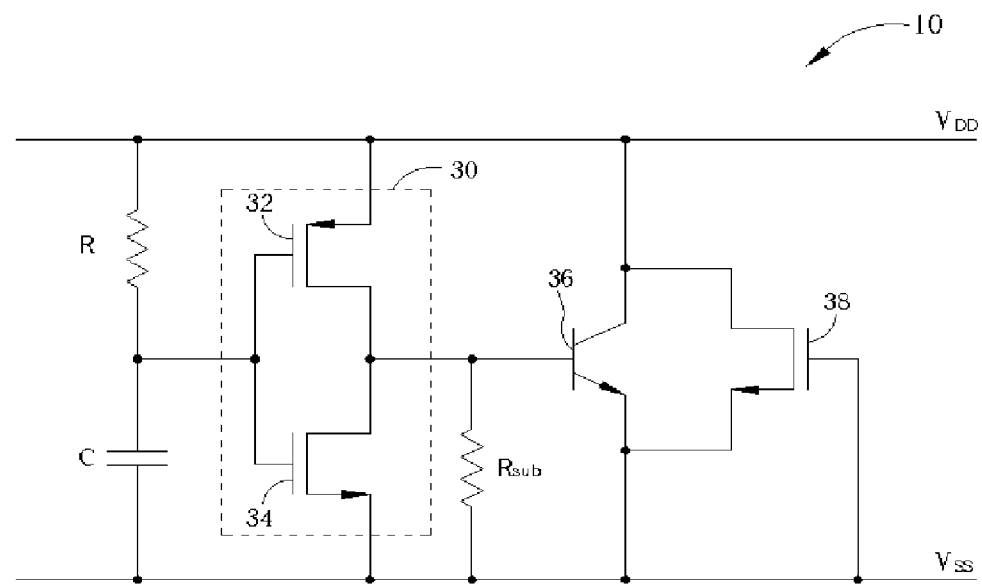
FIG. 2 is a circuit diagram of the ESD protection circuit shown in FIG. 1.
Figure 3:
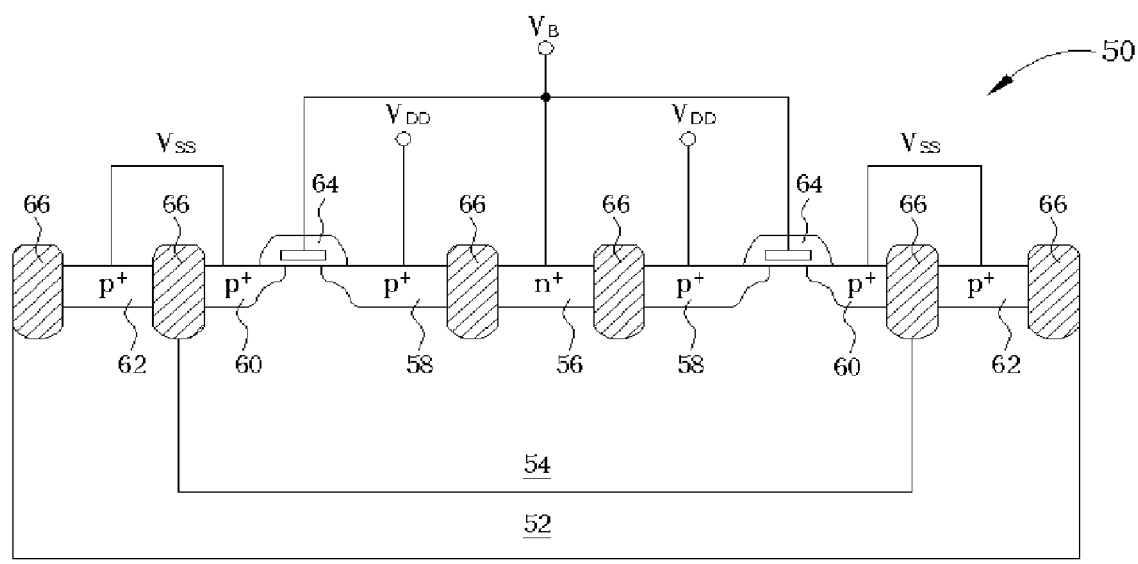
FIG. 3 is a structure diagram of another substrate-triggered ESD protection circuit according to the prior art.
Figure 4:
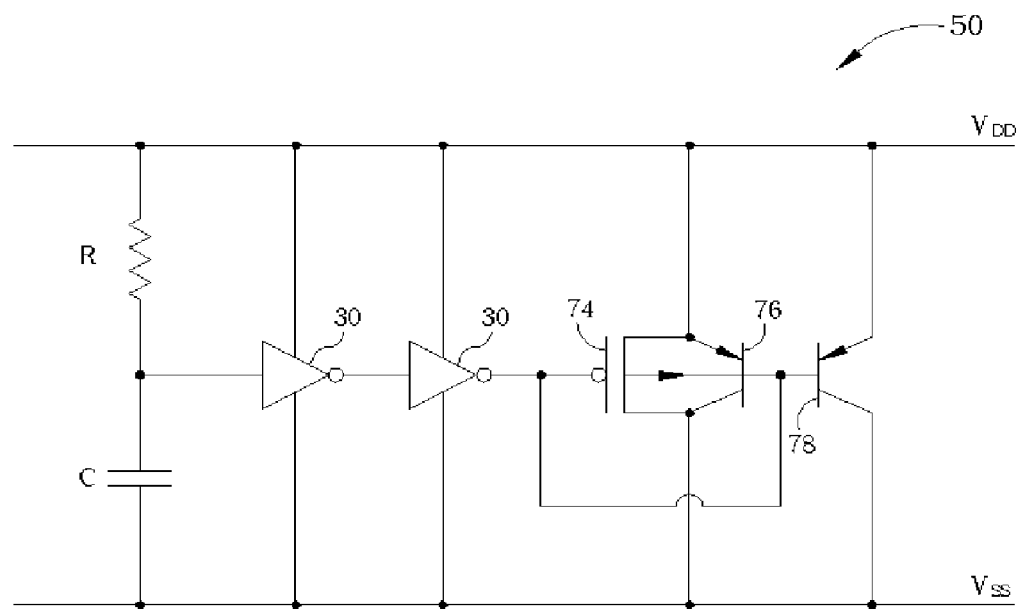
FIG. 4 is a circuit diagram of the ESD protection circuit shown in FIG. 1.

As an ESD phenomenon of the ESD protection circuit 100 occurs, a positive pulse is applied to the first power terminal $V_{DD}$. Therefore, the N-well 104 is at a high state via the first $n^+$ diffusion region 114, and the N-well 104 electrically isolates the P-well 106 from the P-type substrate 102. While the capacitor C is charged, the voltage level of the input terminal of the inverter 30 is pulled up. Therefore, the input terminal of the inverter 30 is at a low state when the ESD phenomenon begins so that the PMOS transistor (i.e. the PMOS transistor 32 shown in FIG. 1) is turned on. The second $p^+$ diffusion region 118, thus, is applied by a positive voltage. Because the second $p^+$ diffusion region 118 is applied by a positive voltage and the third $n^+$ diffusion region 116 is grounded, a PN junction is formed between the P-well 118 and the third $n^+$ diffusion region 116. The parasitic lateral n-p-n BJT of the NMOS transistor 150, thus, is turned on, and the ESD current flows from the first power terminal $V_{DD}$ through the parasitic lateral n-p-n BJT to the grounded terminal. Moreover, when a positive pulse is applied to the first power terminal $V_{DD}$, a PN junction is formed between the P-well 106 and the third $n^+$ diffusion region 116, so the equivalent circuit between the base and the emitter of the parasitic lateral n-p-n BJT of the NMOS transistor 150 can be regarded as a diode without connecting to any resistor in parallel. Therefore, in contrast to the prior art ESD protection circuit 10, the ESD protection circuit 100 turns on the parasitic lateral n-p-n BJT without pulling up a voltage level of any resistor, such as the substrate resistor Rsub shown in FIG. 1. Therefore, the turn-on efficiency of the ESD protection circuit 100 is better than that of the ESD protection circuit 10. Moreover, because the mobility of electrons is greater than the mobility of holes, the discharge performance of the ESD protection circuit 100 is better than that of the ESD protection circuit 50.

Figure 7:
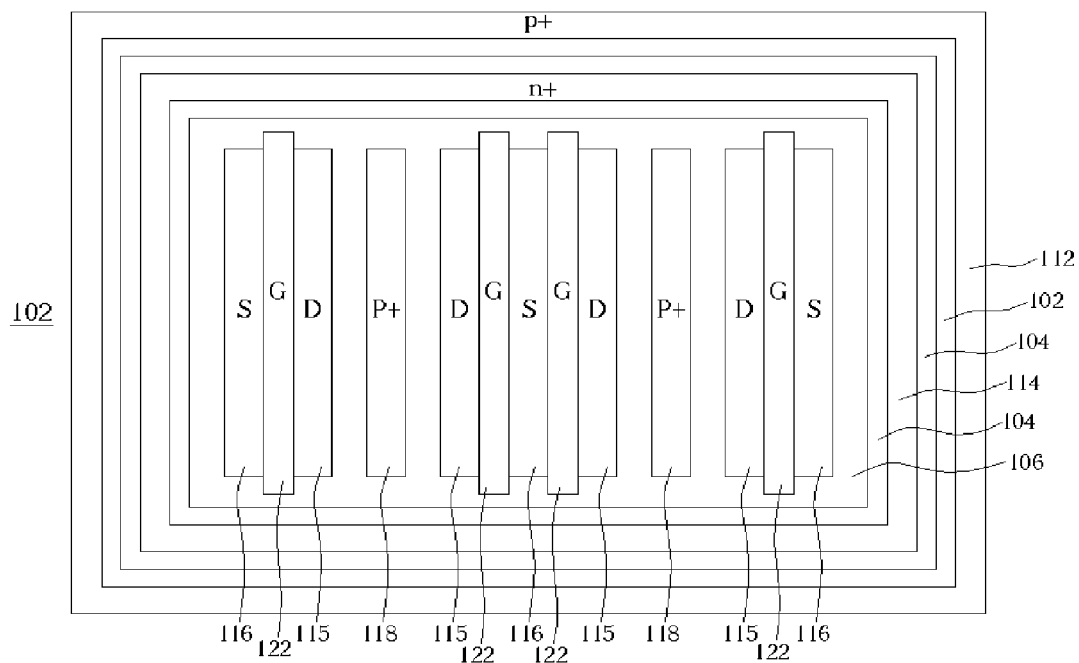
FIG. 7 is a layout diagram of the ESD protection circuit shown in FIG. 5.

Please refer to FIG. 7, which is a layout diagram of the ESD protection circuit 100 shown in FIG. 5. The N-well 104 is surrounded by the first $p^+$ diffusion region 112, and the P-well 106 is surrounded by the first $n^+$ diffusion region 114. The second $p^+$ diffusion region 118 is positioned between two of the second $n^+$ diffusion regions 115, i.e. the drains of the NMOS transistors 150.

Figure 8:
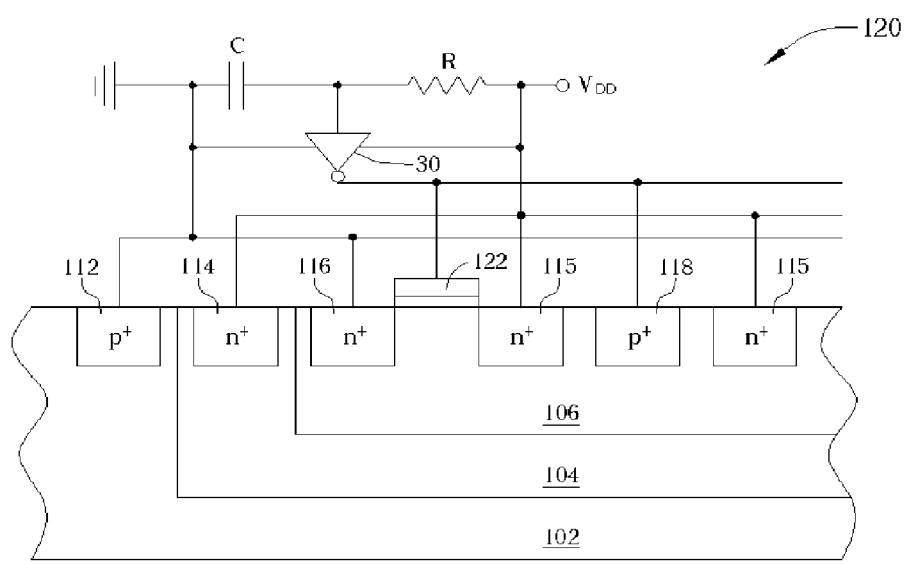
FIG. 8 is a structure diagram of second embodiment substrate-triggered ESD protection circuit according to the present invention.
Figure 9:
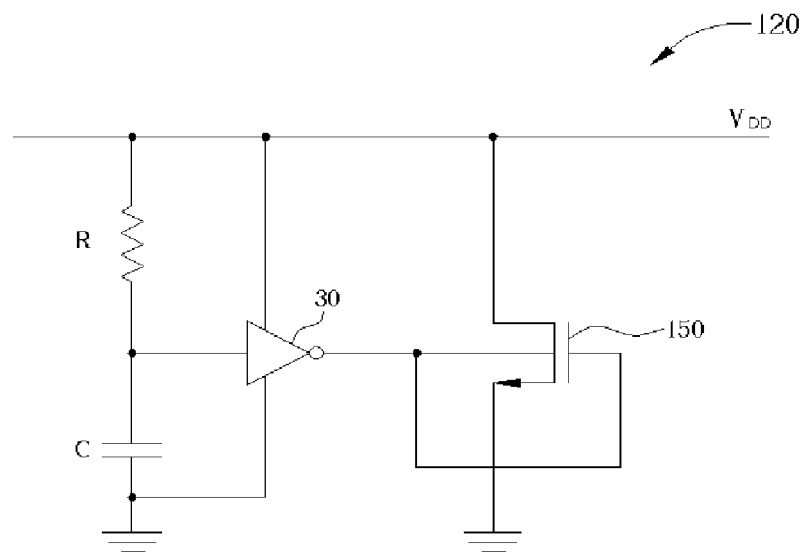
FIG. 9 is a circuit diagram of the ESD protection circuit shown in FIG. 8.

Please refer to FIG. 8 and FIG. 9. FIG. 8 is a structure diagram of second embodiment substrate-triggered ESD protection circuit 120 according to the present invention. FIG. 9 is a circuit diagram of the ESD protection circuit 120 shown in FIG. 8. The structure of the ESD protection circuit 120 is similar to the ESD protection circuit 100, and the difference between the two ESD protection circuits 100 and 120 is that the gate 122 of the NMOS transistor 150 of the ESD protection circuit 100 is connected to the grounded terminal and the gate 122 of the NMOS transistor 150 of the ESD protection circuit 120 is connected to the output terminal of the inverter 30.

Figure 10:
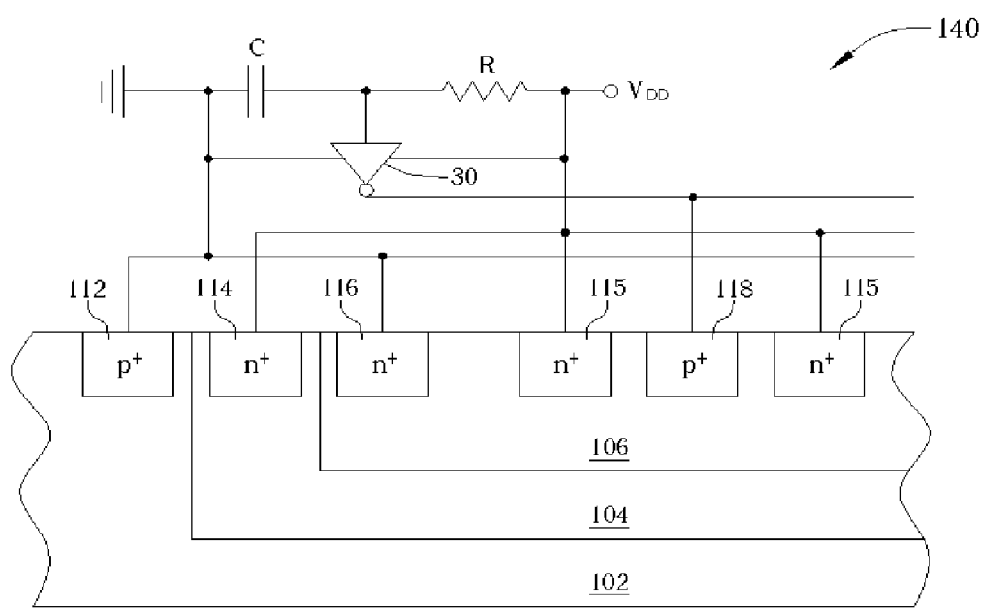
FIG. 10 is a structure diagram of third embodiment substrate-triggered ESD protection circuit according to the present invention.
Figure 11:
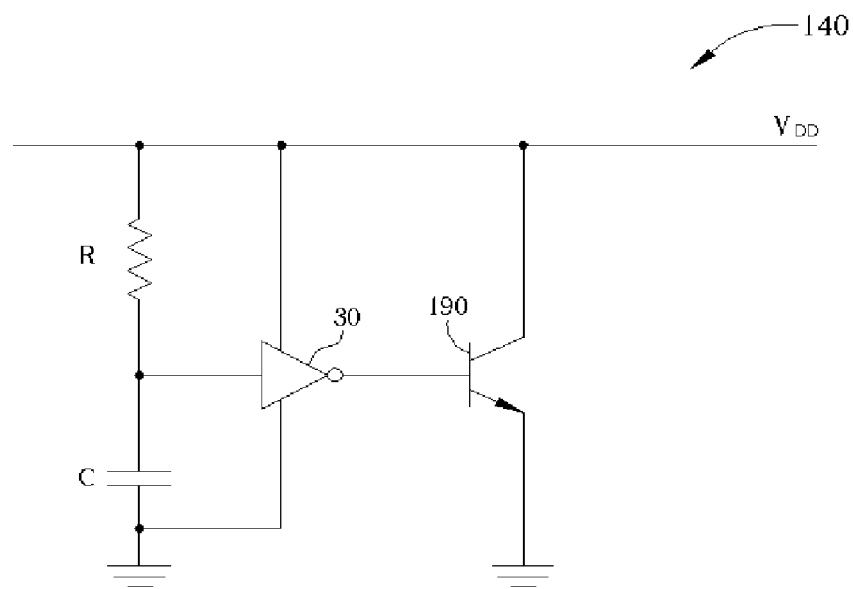
FIG. 11 is a circuit diagram of the ESD protection circuit shown in FIG. 10.

Please refer to FIG. 10 and FIG. 11. FIG. 10 is a structure diagram of third embodiment substrate-triggered ESD protection circuit 140 according to the present invention. FIG. 11 is a circuit diagram of the ESD protection circuit 140 shown in FIG. 10. The structure of the ESD protection circuit 140 is similar to the ESD protection circuit 100, and the difference between the two ESD protection circuits 100 and 140 is that the ESD protection circuit 140 does not contain the doped polysilicon gate 24 and has a NPN BJT 190 formed in the P-well 106 for replacing the NMOS transistor 150 of the ESD protection circuit 100.

Figure 12:
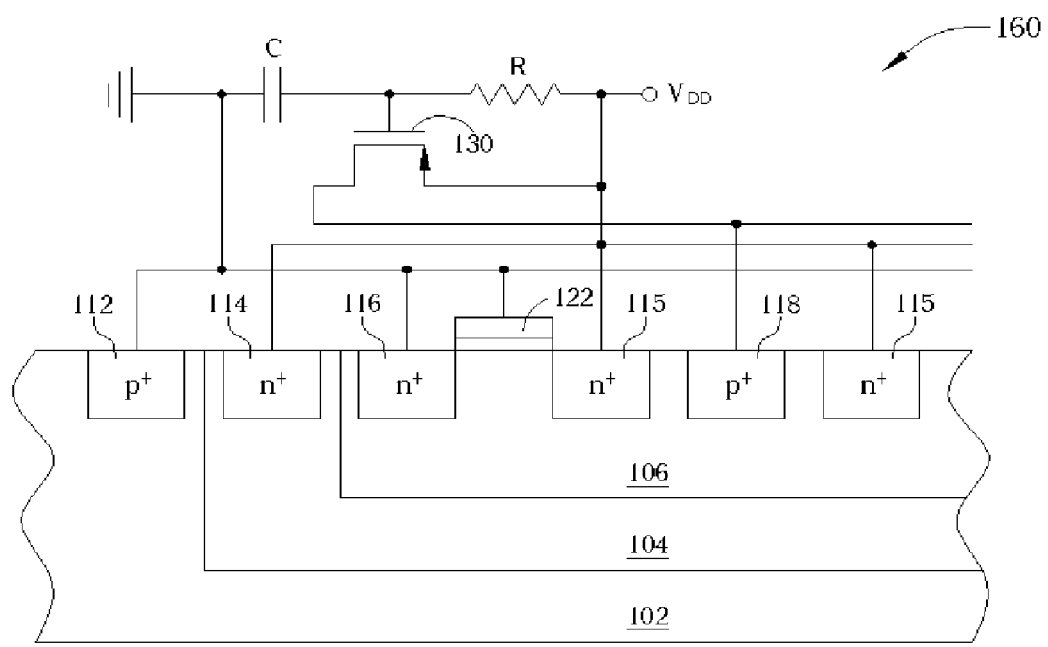
FIG. 12 is a structure diagram of fourth embodiment substrate-triggered ESD protection circuit according to the present invention.
Figure 13:
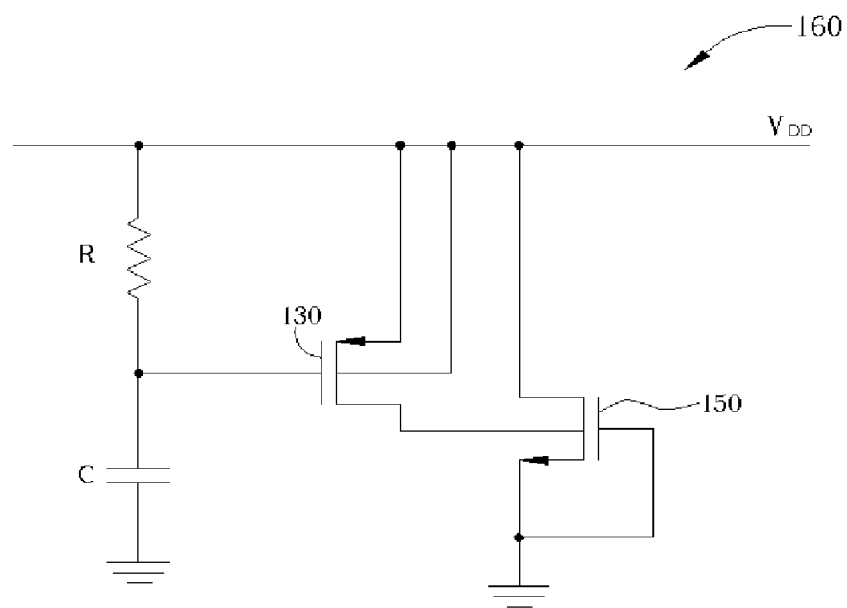
FIG. 13 is a circuit diagram of the ESD protection circuit shown in FIG. 12.

Please refer to FIG. 12 and FIG. 13. FIG. 12 is a structure diagram of fourth embodiment substrate-triggered ESD protection circuit 160 according to the present invention. FIG. 13 is a circuit diagram of the ESD protection circuit 160 shown in FIG. 12. The structure of the ESD protection circuit 160 is similar to the ESD protection circuit 100, and the difference between the two ESD protection circuits 100 and 160 is that the ESD protection circuit 160 has a PMOS transistor 130 for replacing the inverter 30 of the ESD protection circuit 100. When an ESD phenomenon of the ESD protection circuit 160 occurs, the PMOS transistor 130 makes the P-well at a high state, so the ESD ability of the PMOS transistor 130 is similar to that of the ESD protection circuit 100.

Figure 14:
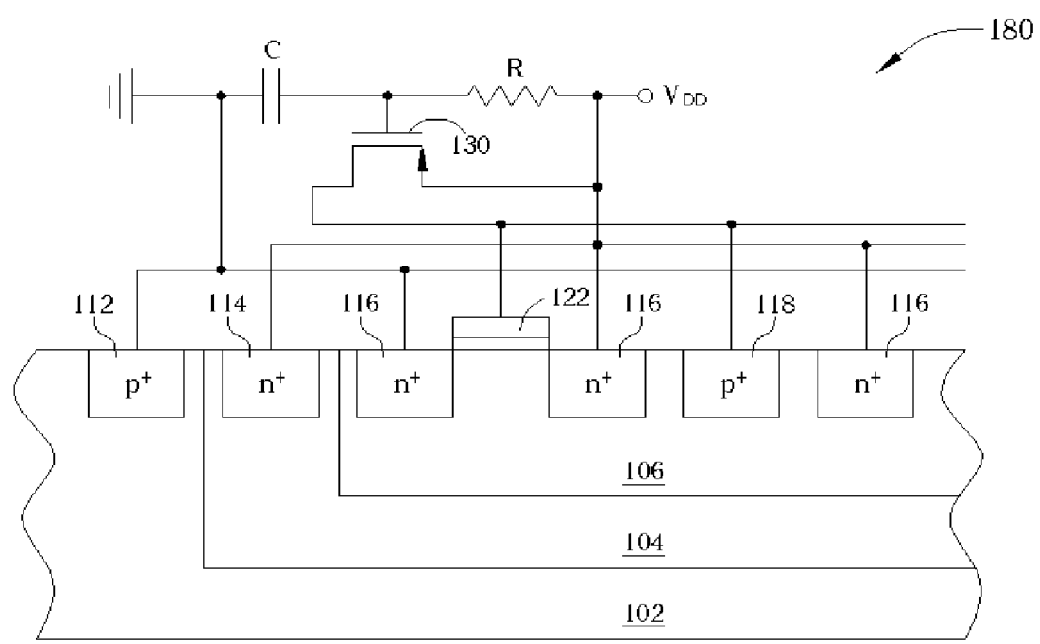
FIG. 14 is a structure diagram of fifth embodiment substrate-triggered ESD protection circuit according to the present invention.
Figure 15:
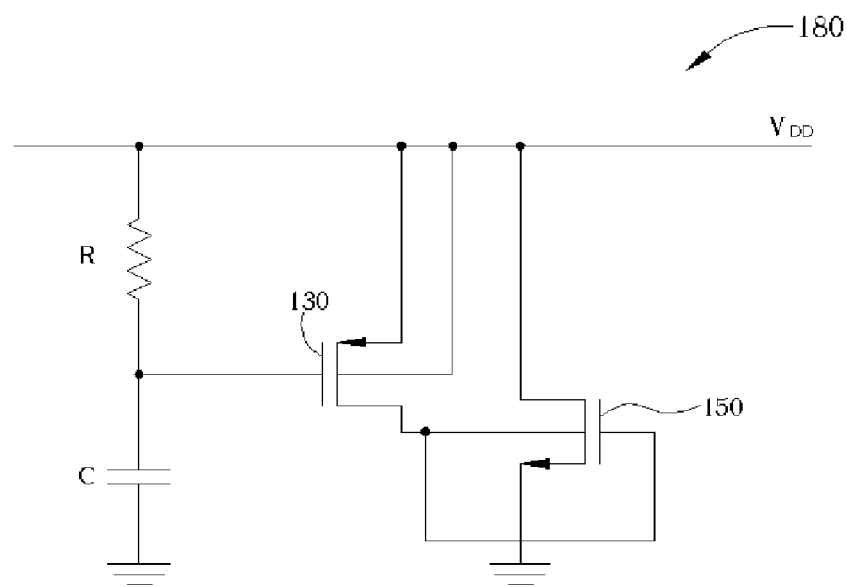
FIG. 15 is a circuit diagram of the ESD protection circuit shown in FIG. 14.

Please refer to FIG. 14 and FIG. 15. FIG. 14 is a structure diagram of fifth embodiment substrate-triggered ESD protection circuit 180 according to the present invention. FIG. 14 is a circuit diagram of the ESD protection circuit 180 shown in FIG. 14. The structure of the ESD protection circuit 180 is similar to the ESD protection circuit 120, and the difference between the two ESD protection circuits 180 and 120 is that the ESD protection circuit 180 has a PMOS transistor 130 for replacing the inverter 30 of the ESD protection circuit 120.

Figure 16:
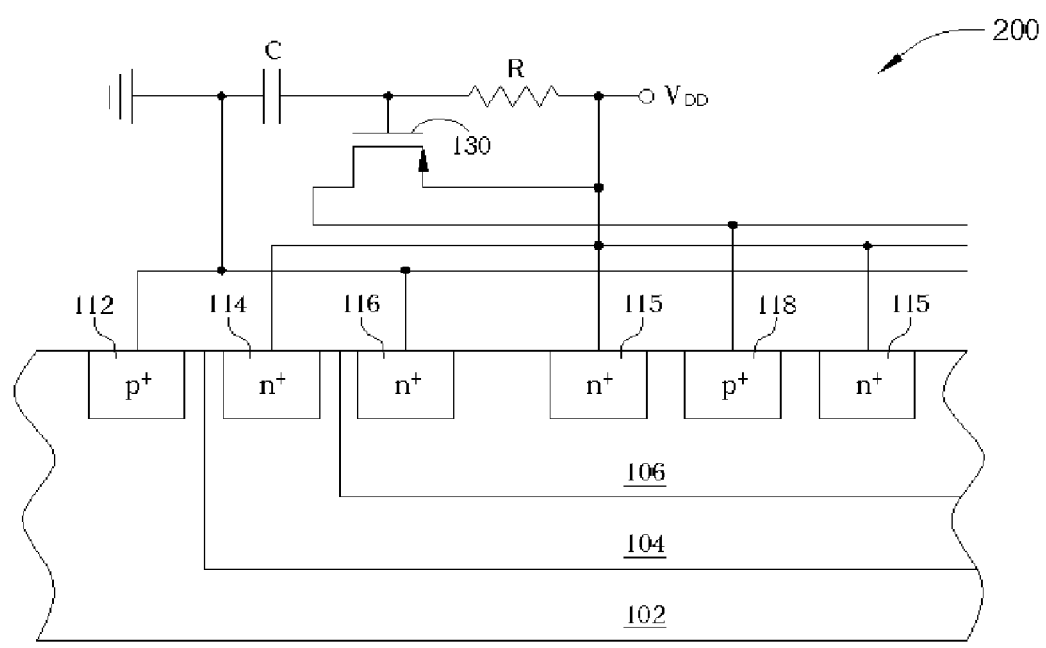
FIG. 16 is a structure diagram of sixth embodiment substrate-triggered ESD protection circuit according to the present invention.
Figure 17:
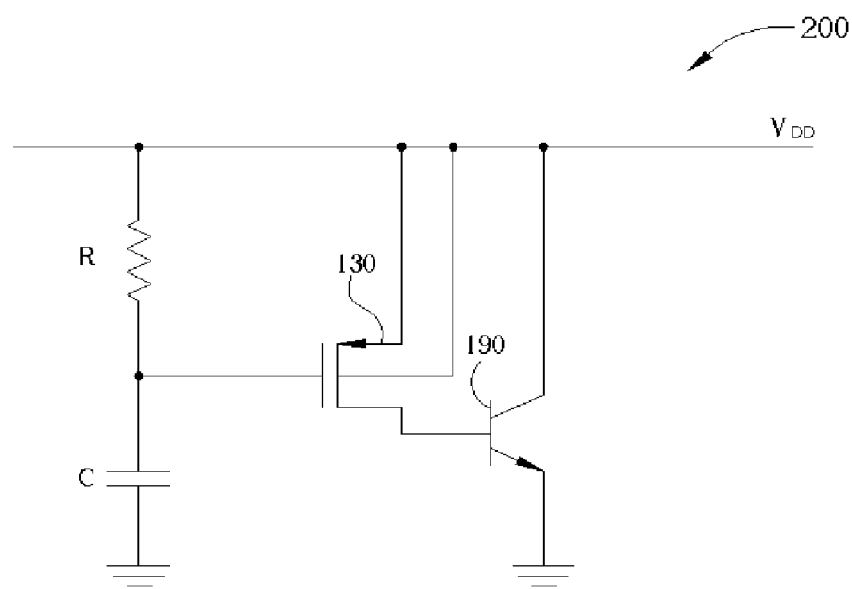
FIG. 17 is a circuit diagram of the ESD protection circuit shown in FIG. 16.

Please refer to FIG. 16 and FIG. 17. FIG. 16 is a structure diagram of sixth embodiment substrate-triggered ESD protection circuit 200 according to the present invention. FIG. 17 is a circuit diagram of the ESD protection circuit 200 shown in FIG. 16. The structure of the ESD protection circuit 200 is similar to the ESD protection circuit 140, and the difference between the two ESD protection circuits 200 and 140 is that the ESD protection circuit 200 has a PMOS transistor 130 for replacing the inverter 30 of the ESD protection circuit 140.

Figure 18:
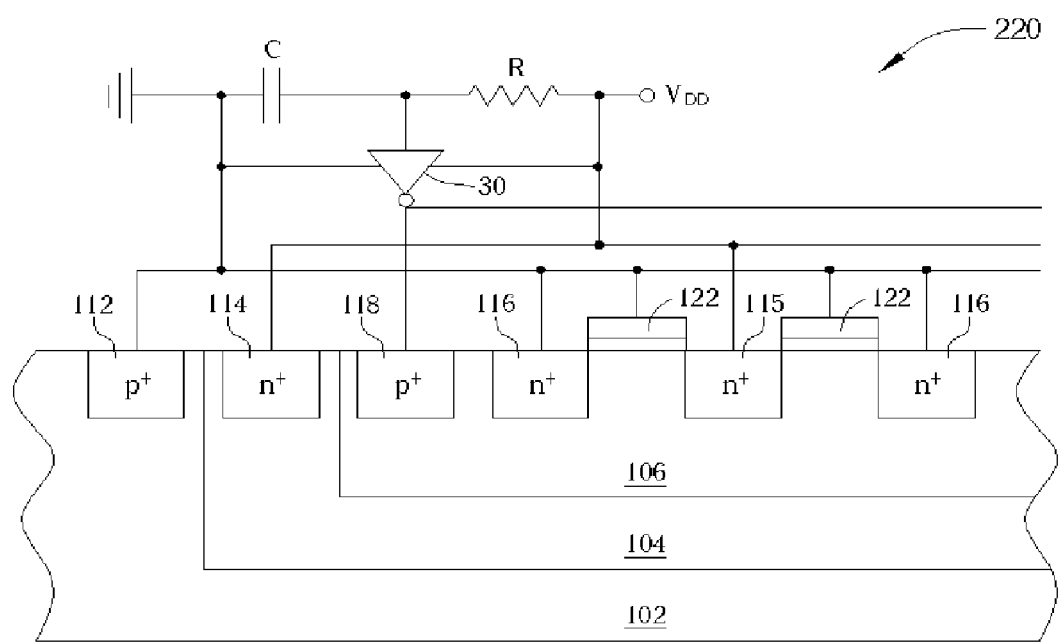
FIG. 18 is a structure diagram of seventh embodiment substrate-triggered ESD protection circuit according to the present invention.
Figure 19:
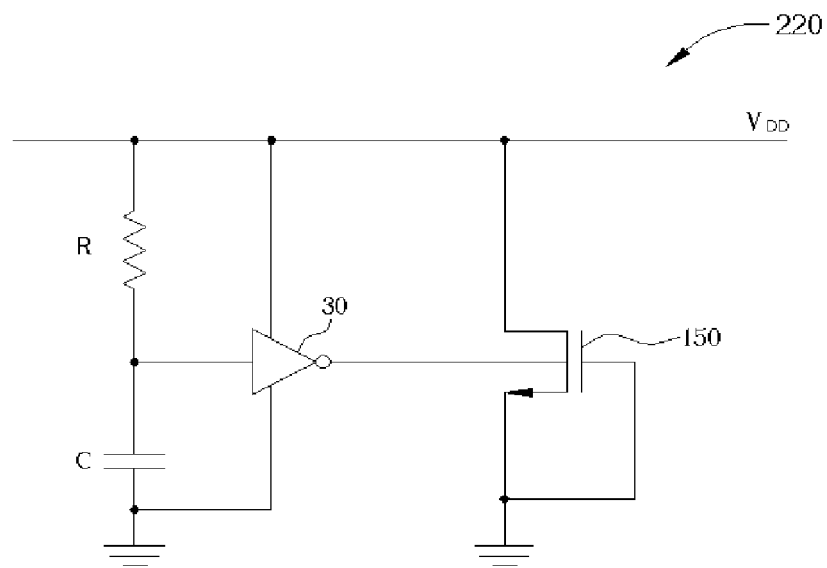
FIG. 19 is a circuit diagram of the ESD protection circuit shown in FIG. 18.
Figure 20:
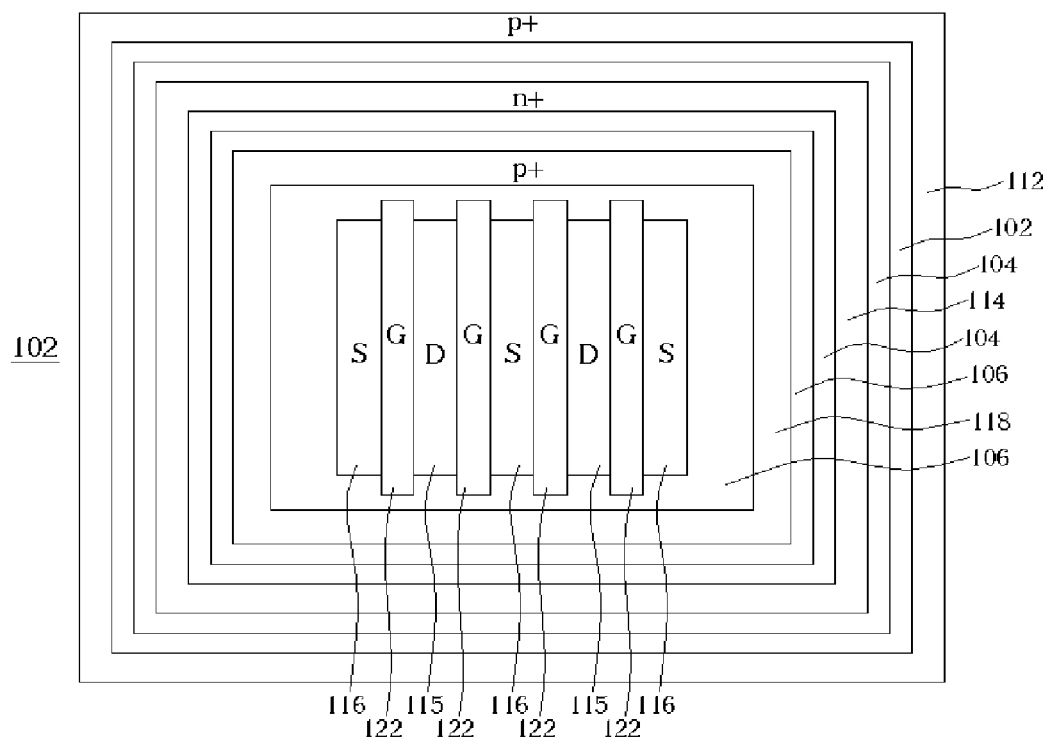
FIG. 20 is a layout diagram of the ESD protection circuit shown in FIG. 18.

Please refer to FIGS. 18–20, FIG. 18 is a structure diagram of seventh embodiment substrate-triggered ESD protection circuit 220 according to the present invention, FIG. 19 is a circuit diagram of the ESD protection circuit 220 shown in FIG. 18, and FIG. 20 is a layout diagram of the ESD protection circuit 220 shown in FIG. 18. The circuit design of the ESD protection circuit 220 is the same as that of the ESD protection circuit 100. The differences between the two ESD protection circuits 220 and 100 are their layout. As shown in FIG. 7, in the ESD protection circuit 100, the second p$^+$ diffusion region 118 is positioned between two of the second n$^+$ diffusion regions 115 (i.e. the drains of the NMOS transistors 150). However, as shown in FIG. 20, in the ESD protection circuit 220, the second n$^+$ diffusion regions 115 (i.e. the drains of the NMOS transistors 150) and the third diffusion regions 116 (i.e. the sources of the NMOS transistors 150) are surrounded by the second p$^+$ diffusion region 118. Therefore, the ESD protection circuit 220 has a smaller area than the ESD protection circuit 100.

Figure 21:
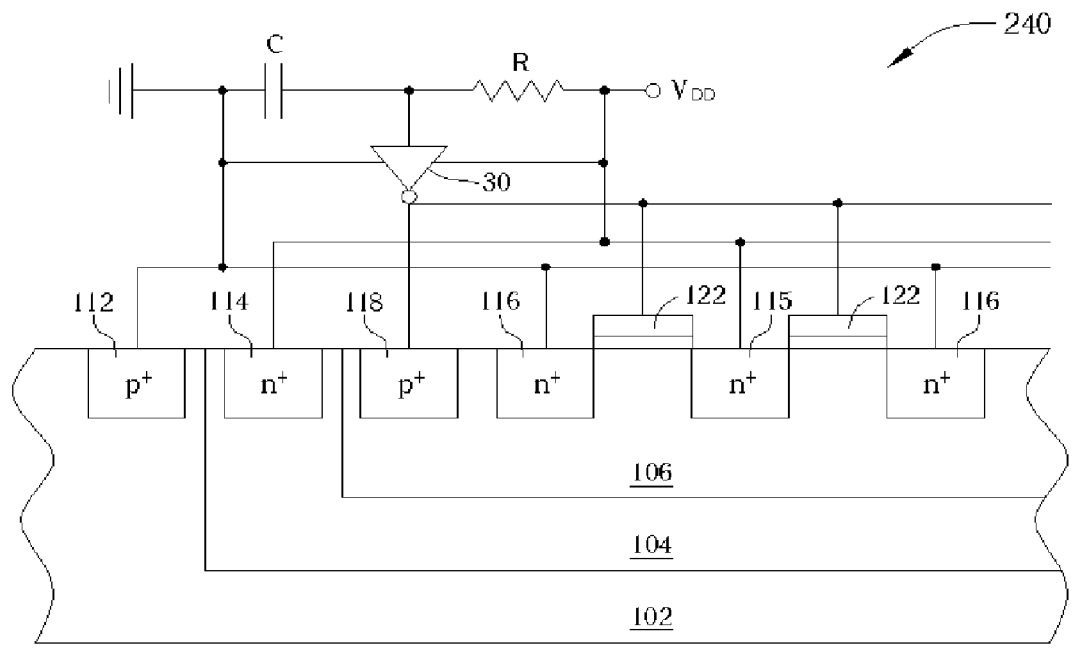
FIG. 21 is a structure diagram of eighth embodiment substrate-triggered ESD protection circuit according to the present invention.
Figure 22:
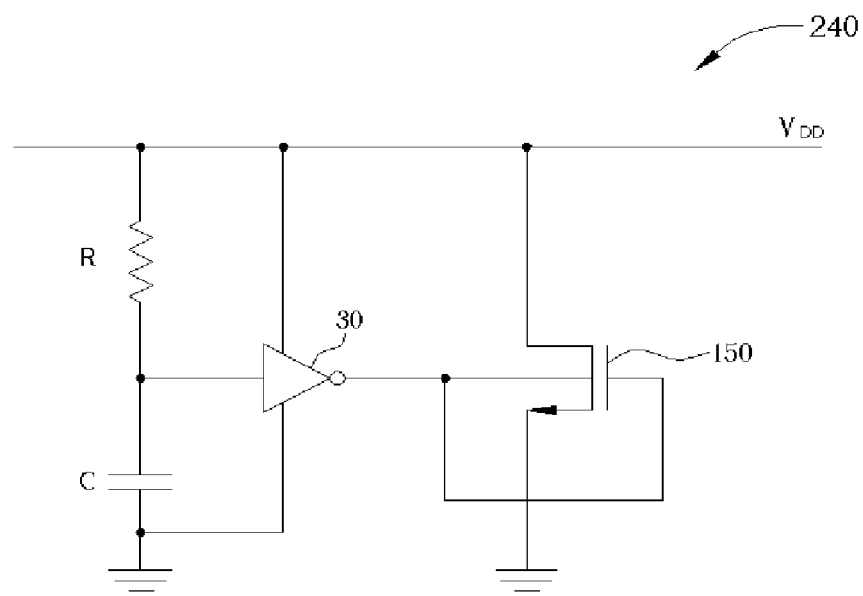
FIG. 22 is a circuit diagram of the ESD protection circuit shown in FIG. 21.

Please refer to FIG. 21 and FIG. 22. FIG. 21 is a structure diagram of eighth embodiment substrate-triggered ESD protection circuit 240 according to the present invention, and FIG. 22 is a circuit diagram of the ESD protection circuit 240 shown in FIG. 21. The circuit design of the ESD protection circuit 240 is the same as that of the ESD protection circuit 120. The differences between the two ESD protection circuits 240 and 120 are their layout. The layout of the ESD protection circuit 120 is the same as the ESD protection circuit 100, shown in FIG. 7. The layout of the ESD protection circuit 240 is the same as the ESD protection circuit 220, shown in FIG. 20.

Figure 23:
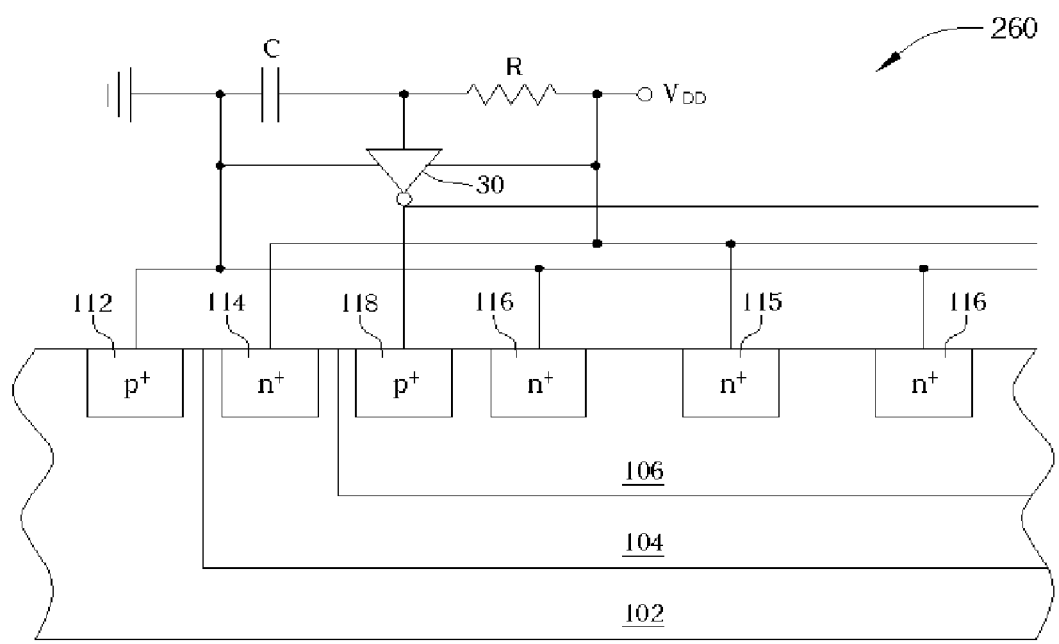
FIG. 23 is a structure diagram of ninth embodiment substrate-triggered ESD protection circuit according to the present invention.
Figure 24:
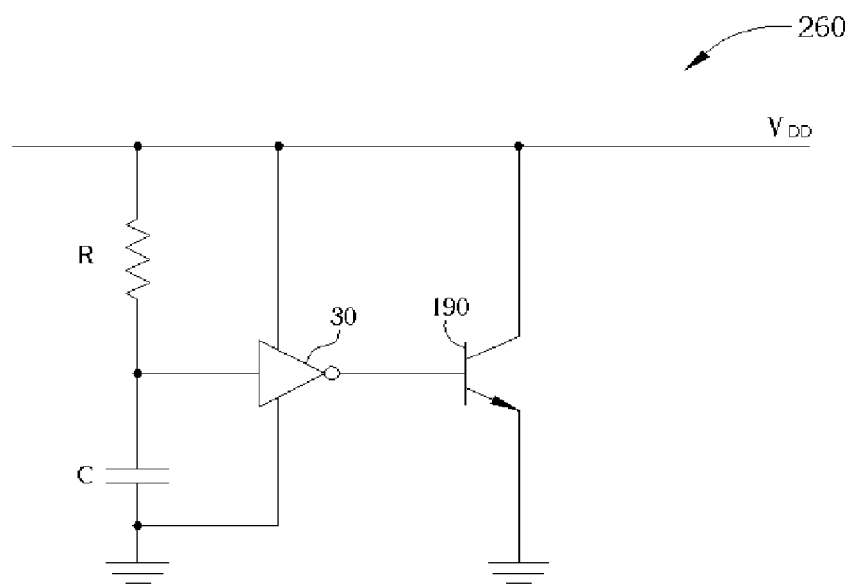
FIG. 24 is a circuit diagram of the ESD protection circuit shown in FIG. 23.

Please refer to FIG. 23 and FIG. 24. FIG. 23 is a structure diagram of ninth embodiment substrate-triggered ESD protection circuit 260 according to the present invention, and FIG. 24 is a circuit diagram of the ESD protection circuit 260 shown in FIG. 23. The circuit design of the ESD protection circuit 260 is the same as that of the ESD protection circuit 140. The differences between the two ESD protection circuits 260 and 140 are their layout. The layout of the ESD protection circuit 140 is the same as the ESD protection circuit 100, shown in FIG. 7. The layout of the ESD protection circuit 260 is the same as the ESD protection circuit 220, shown in FIG. 20.

Figure 25:
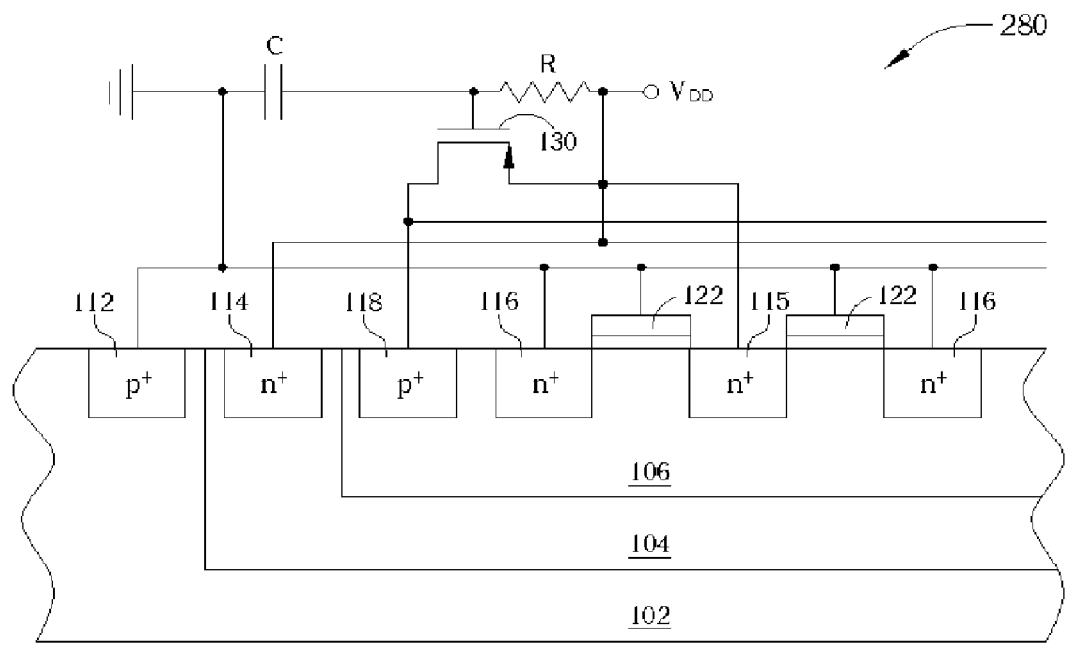
FIG. 25 is a structure diagram of tenth embodiment substrate-triggered ESD protection circuit according to the present invention.
Figure 26:
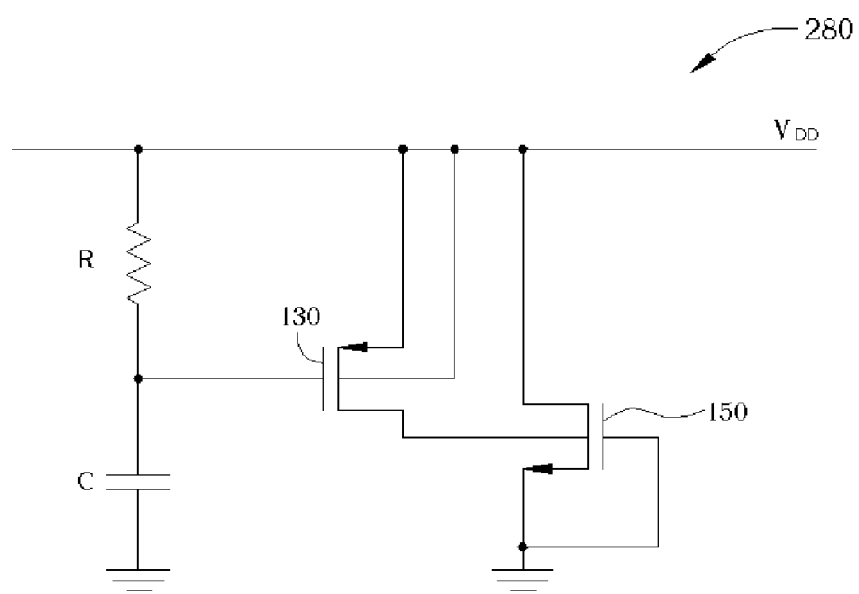
FIG. 26 is a circuit diagram of the ESD protection circuit shown in FIG. 26.

Please refer to FIG. 25 and FIG. 26. FIG. 25 is a structure diagram of tenth embodiment substrate-triggered ESD protection circuit 280 according to the present invention, and FIG. 25 is a circuit diagram of the ESD protection circuit 280 shown in FIG. 25. The circuit design of the ESD protection circuit 280 is the same as that of the ESD protection circuit 160. The differences between the two ESD protection circuits 280 and 160 are their layout. The layout of the ESD protection circuit 160 is the same as the ESD protection circuit 100, shown in FIG. 7. The layout of the ESD protection circuit 280 is the same as the ESD protection circuit 220, shown in FIG. 20.

Figure 27:
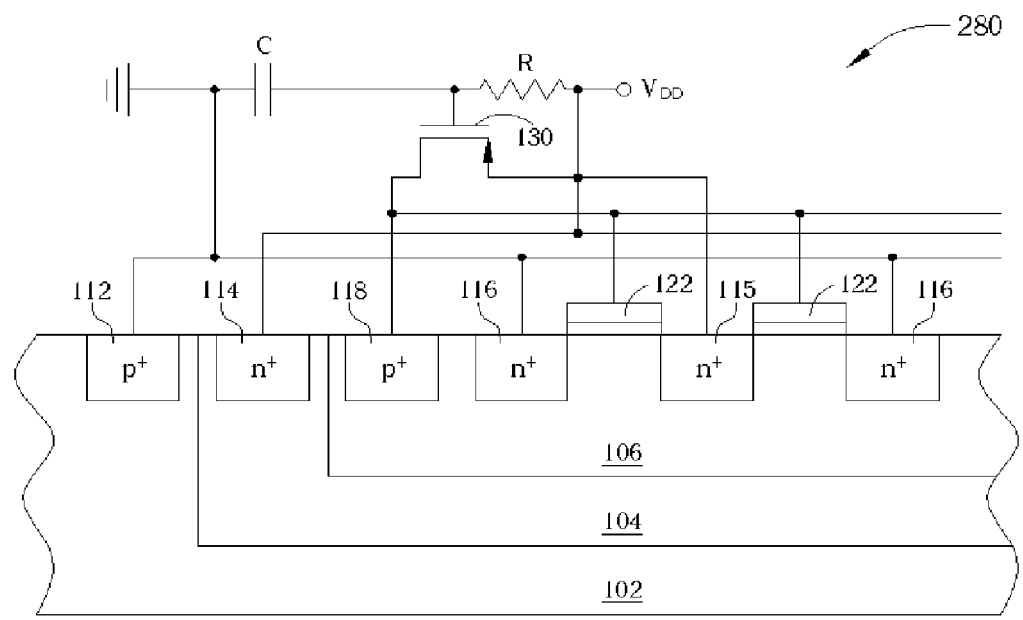
FIG. 27 is a structure diagram of eleventh embodiment substrate-triggered ESD protection circuit according to the present invention.
Figure 28:
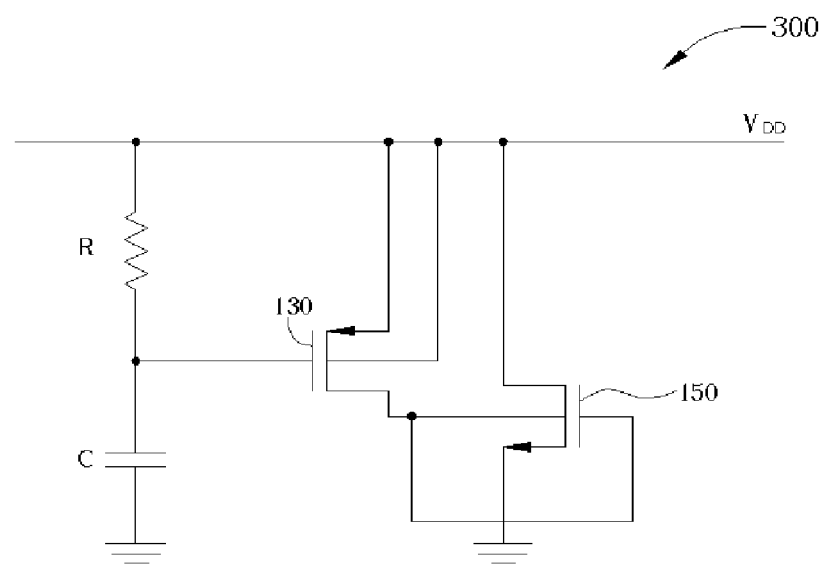
FIG. 28 is a circuit diagram of the ESD protection circuit shown in FIG. 27.

Please refer to FIG. 27 and FIG. 28. FIG. 27 is a structure diagram of eleventh embodiment substrate-triggered ESD protection circuit 300 according to the present invention, and FIG. 28 is a circuit diagram of the ESD protection circuit 300 shown in FIG. 27. The circuit design of the ESD protection circuit 300 is the same as that of the ESD protection circuit 180. The differences between the two ESD protection circuits 300 and 180 are their layout. The layout of the ESD protection circuit 180 is the same as the ESD protection circuit 100, shown in FIG. 7. The layout of the ESD protection circuit 300 is the same as the ESD protection circuit 220, shown in FIG. 20.

Figure 29:
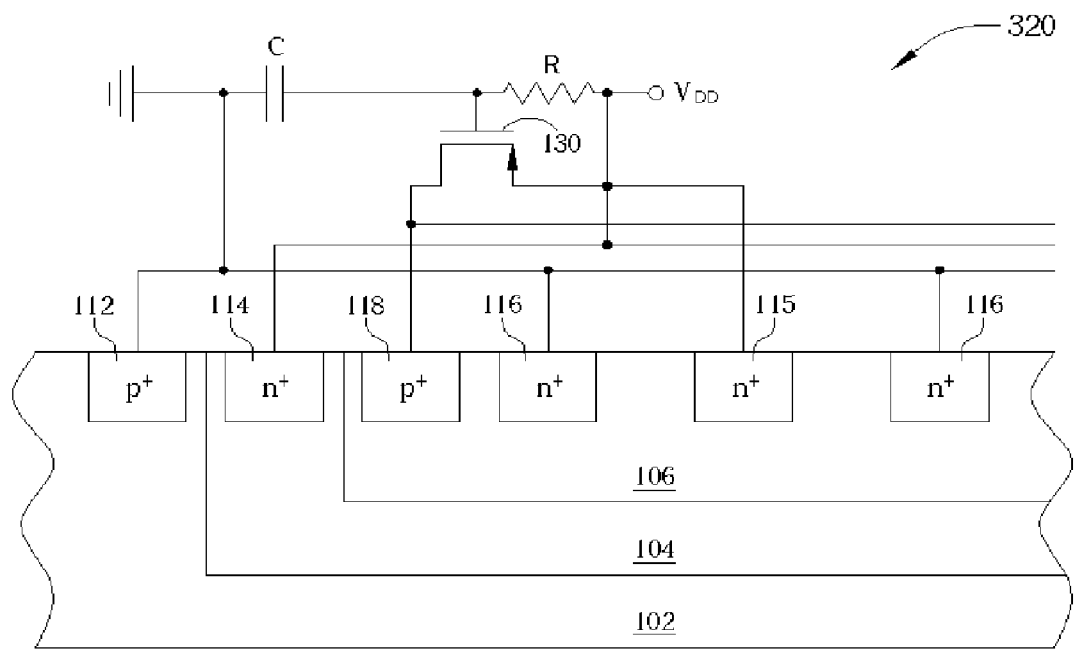
FIG. 29 is a structure diagram of twelfth embodiment substrate-triggered ESD protection circuit according to the present invention.
Figure 30:
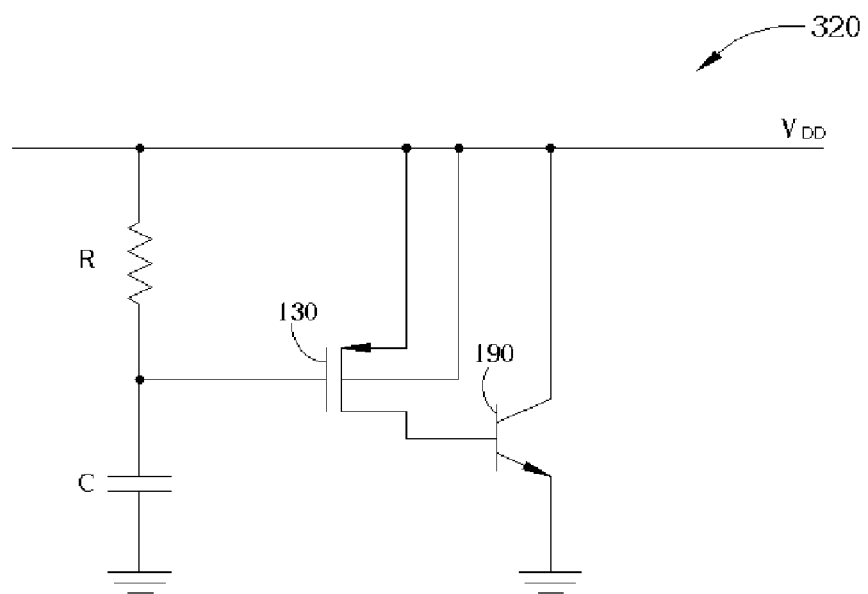
FIG. 30 is a circuit diagram of the ESD protection circuit shown in FIG. 29.

Please refer to FIG. 29 and FIG. 30. FIG. 29 is a structure diagram of twelfth embodiment substrate-triggered ESD protection circuit 320 according to the present invention, and FIG. 30 is a circuit diagram of the ESD protection circuit 320 shown in FIG. 29. The circuit design of the ESD protection circuit 320 is the same as that of the ESD protection circuit 200. The differences between the two ESD protection circuits 320 and 200 are their layout. The layout of the ESD protection circuit 200 is the same as the ESD protection circuit 100, shown in FIG. 7. The layout of the ESD protection circuit 320 is the same as the ESD protection circuit 220, shown in FIG. 20.

In contrast to the prior substrate-triggered ESD protection circuit, each of substrate-triggered ESD protection circuits according to the present invention is formed on a P-type substrate and comprises a triple-well structure. Each of the ESD protection circuits has a N-well in the P-type substrate and a P-well in the N-well. The N-well is connected to a first power terminal via a first n$^+$ diffusion region, the P-type substrate is connected to a second power terminal via a first p$^+$ diffusion region, and the P-well is connected to an output terminal of an ESD detecting circuit via a second p$^+$ diffusion region. The ESD detecting circuit is used to change a voltage level of the P-well. When a static electricity is inputted into the ESD protection circuit via the first power terminal, the N-well electrically isolates the P-well from the P-type substrate so that an n-p-n BJT in the P-well is turned on immediately as the static electricity is inputted into the ESD protection circuit. Therefore, the ESD protection circuits not only have ideal turn-on efficiency but also have excellent discharge performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection circuit formed on a P-type substrate comprising:
    a first power terminal;
    a second power terminal;
    a resistor connected to the first power terminal;
    a capacitor connected between the resistor and the second power terminal;
    a first p$^+$ diffusion region in the P-type substrate connected to the second power terminal;
    an N-well in the P-type substrate;
    a first n$^+$ diffusion region in the N-well connected to the first power terminal;
    a P-well in the N-well;
    at least a second p$^+$ diffusion region in the P-well, at least a second n$^+$ diffusion region in the P-well connected to the first power terminal, and at least third n$^+$ diffusion region in the P-well connected to the second power terminal; and
    an ESD detecting circuit connected to the first power terminal having an input terminal connected to the resistor and the capacitor and a output terminal connected to the second p$^+$ diffusion region, wherein the output terminal outputs signal opposite to signal received by the input terminal so as to change a voltage level of the P-well.

2. The ESD protection circuit of claim 1, wherein when a positive pulse is applied to the first power terminal, a PN junction is formed between the P-well and the third n$^+$ diffusion region.

3. The ESD protection circuit of claim 1, wherein there is at least an NMOS transistor in the P-well, a drain of the NMOS transistor is the second n$^+$ diffusion region, a source of the NMOS transistor is the third n$^+$ diffusion region, and a body of the NMOS transistor is the P-well.

4. The ESD protection circuit of claim 3, wherein a gate of the NMOS transistor is connected to the second power terminal.

5. The ESD protection circuit of claim 3, wherein a gate of the NMOS transistor is connected to the output terminal of the ESD detecting circuit.

6. The ESD protection circuit of claim 1, wherein an n-p-n bipolar junction transistor (BJT) is formed in the P-well, a collector of the BJT is the second $n^+$ diffusion region, a base of the BJT is the P-well, and a emitter of the BJT is the third $n^+$ diffusion region.

7. The ESD protection circuit of claim 1, wherein the ESD detecting circuit is an inverter.

8. The ESD protection circuit of claim 1, wherein the ESD detecting circuit is a PMOS transistor.

9. The ESD protection circuit of claim 1, wherein the second $p^+$ diffusion region is positioned between two of the second $n^+$ diffusion regions.

10. The ESD protection circuit of claim 1, wherein the second $n^+$ diffusion region and the third $n^+$ diffusion region are surrounded by the second $p^+$ diffusion region.

11. An electrostatic discharge (ESD) protection circuit formed on a P-type substrate comprising:
a first $p^+$ diffusion region in the P-type substrate;
an N-well in the P-type substrate;
a first $n^+$ diffusion region in the N-well;
a P-well in the N-well; and
an n-p-n bipolar junction transistor (BJT) formed in the P-well, wherein an equivalent circuit between a base and a emitter of the BJT is a diode without connecting to any resistor in parallel.

12. The ESD protection circuit of claim 11 further comprising:
a first power terminal connected to the first $n^+$ diffusion region;
a second power terminal connected to the first $p^+$ diffusion region;
a resistor connected to the first power terminal;
a capacitor connected between the resistor and the second power terminal;
at least a second $p^+$ diffusion region in the P-well, at least a second $n^+$ diffusion region in the P-well connected to the first power terminal, and at least third $n^+$ diffusion region in the P-well connected to the second power terminal; and
an ESD detecting circuit connected to the first power terminal having an input terminal connected to the resistor and the capacitor and a output terminal connected to the second $p^+$ diffusion region, wherein the output terminal outputs signal opposite to signal received by the input terminal so as to change a voltage level of the P-well.

13. The ESD protection circuit of claim 12, wherein there is at least an NMOS transistor formed in the P-well, a drain of the NMOS transistor is the second $n^+$ diffusion region, a source of the NMOS transistor is the third $n^+$ diffusion region, and a body of the NMOS transistor is the P-well, the n-p-n BJT is a parasitic lateral bipolar junction transistor of the NMOS transistor.

14. The ESD protection circuit of claim 13, wherein a gate of the NMOS transistor is connected to the second power terminal.

15. The ESD protection circuit of claim 13, wherein a gate of the NMOS transistor is connected to the output terminal of the ESD detecting circuit.

16. The ESD protection circuit of claim 12, wherein a collector of the BJT is the second $n^+$ diffusion region, a base of the BJT is the P-well, and a emitter of the BJT is the third $n^+$ diffusion region.

17. The ESD protection circuit of claim 12, wherein the ESD detecting circuit is an inverter.

18. The ESD protection circuit of claim 12, wherein the ESD detecting circuit is a PMOS transistor.

19. The ESD protection circuit of claim 12, wherein the second $p^+$ diffusion region is positioned between two of the second $n^+$ diffusion regions.

20. The ESD protection circuit of claim 12, wherein the second $n^+$ diffusion region and the third $n^+$ diffusion region are surrounded by the second $p^+$ diffusion region.

* * * * *